(12) United States Patent
Chau

(10) Patent No.: US 6,737,990 B1
(45) Date of Patent: *May 18, 2004

(54) KEY INPUT APPARATUS INTERFACE

(75) Inventor: Paul Chau, Nashua, NH (US)

(73) Assignee: Spyrus, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/012,241

(22) Filed: Jan. 23, 1998

(51) Int. Cl.$^7$ .............................................. H03M 11/00
(52) U.S. Cl. ............................ 341/22; 341/26; 341/34; 200/5 A; 338/92; 338/118
(58) Field of Search ............................ 341/26, 22, 25, 341/33, 34; 200/5 A; 219/685; 323/304; 178/18.05; 338/69, 118, 92, 96

(56) References Cited

U.S. PATENT DOCUMENTS

| | | | | | |
|---|---|---|---|---|---|
| 3,624,584 A | * | 11/1971 | Ohno | ........................... | 338/69 |
| 3,699,492 A | * | 10/1972 | Yoshihara | ..................... | 338/69 |
| 3,895,288 A | * | 7/1975 | Lampen et al. | ............. | 338/119 |
| 4,444,998 A | * | 4/1984 | House | ..................... | 178/18.05 |
| 4,451,714 A | * | 5/1984 | Eventoff | ..................... | 200/5 A |
| 4,575,601 A | * | 3/1986 | Taguchi | ..................... | 200/5 A |
| 4,725,817 A | * | 2/1988 | Wihlborg | ..................... | 341/34 |
| 4,746,953 A | * | 5/1988 | Knodt | ........................... | 200/5 A |
| 4,918,634 A | | 4/1990 | Nishimori | ................... | 364/709 |
| 4,920,253 A | * | 4/1990 | Takei | ......................... | 219/506 |
| 5,057,836 A | | 10/1991 | Inaba | ......................... | 341/26 |
| 5,448,236 A | | 9/1995 | Shiga | ......................... | 341/25 |
| 5,534,860 A | | 7/1996 | Phillips et al. | ................. | 341/22 |
| 5,550,339 A | * | 8/1996 | Haugh | ......................... | 200/5 A |
| 5,945,929 A | * | 8/1999 | Westra | ......................... | 341/34 |

* cited by examiner

Primary Examiner—Albert K. Wong

(57) ABSTRACT

A compact key input apparatus interface includes a resistive element and a number of key contacts on the resistive element. The keys of a key input apparatus are disposed to provide electrical contact between a voltage source and the resistive element at a particular contact point when a corresponding key is depressed, such that a path from the voltage source to ground is made through the resistive element. The keys are arranged along the length of the resistive element so that the depression of any key provides a different conductive path to ground and therefore a different magnitude of current through the conductive path. A corresponding sense voltage measured at a sampling point provides a single-line input to a key decoder, which determines which key is depressed based on the level of the sense voltage.

24 Claims, 4 Drawing Sheets

KEY INPUT APPARATUS INTERFACE

FIELD OF THE INVENTION

The invention relates in general to key input circuits for portable electronic devices and the like, and in particular to the interface between a key input apparatus and a key input decoder.

BACKGROUND OF THE INVENTION

Many devices exist which use a key input apparatus, such as a keyboard or keypad, to provide input data. A difficulty in implementing a full-function key input apparatus in a small space, such as in a portable, hand-held electronic device, is minimizing the size of the keys or key space used to contact the key matrix network commonly used to provide signals to the device from the key input apparatus. Conventional portable electronic units typically utilize conductors in a mesh arrangement on a printed circuit board or membrane-type material to provide the signal interface from the key input apparatus to a key decoder in the unit. The matrix pattern of the mesh arrangement is usually very complicated and requires a large surface area, particularly as the number of keys in the keyboard increases.

Another disadvantage associated with the use of a matrix-type key interface network is that the number of input/output ports required between the matrix and the key decoder is large, usually at least one-half the number of keys on the key input apparatus. Thus, a 16-key input unit for such an electronic device would require at least eight input/output ports on the decoding unit. As the number of required keys increases, the number of necessary input/output ports increases proportionately. Because the decoding unit is typically a microcontroller, the number of required ports greatly impacts not only the size but the cost of the device.

There is therefore a great need for an interface design for a key input apparatus that takes up a minimum amount of space in an electronic device, has a less complicated design than conventional matrix networks, and which minimizes the impact of input/output port allocation of a key decoder within the device.

SUMMARY OF THE INVENTION

It is therefore an object of the invention to provide an interface for a key input apparatus that requires less physical space than does a conventional key interface.

It is a further object of the invention to provide an interface for a key input apparatus that has a simple design.

It is an additional object of the present invention to provide an interface for a key input apparatus that can interface with a key decoder using a minimum number of input/output ports on the decoder.

These and other objects of the invention are achieved by an interface for a key input apparatus to an electronic device, which includes a sense resistance having an input point for connection to a voltage source and a resistive element having a number of contact points, and a ground point for connection to a ground potential. The interface also includes a number of key switches connected to the sense resistance. Each of the number of key switches corresponds to one of the number of contact points, and the key switches are each disposed such that when one of the key switches is asserted, an electrical connection is made between the corresponding contact point and the input point, forming an electrical path from the input point to the ground point through the sense resistance, the asserted key switch, and at least a portion of the resistive element. The interface also includes a sampling point on the electrical path for providing a sampling voltage to a decoder of the electronic device when one of the number of key switches is asserted.

According to one aspect of the invention, the sampling point is a point at which the number of key switches is connected to the sense resistance. Alternatively, the sampling point may be the ground point. The resistive element may have a resistance that is uniform over a length of the resistive element, or the resistive element may have a resistance that is scaled over a length of the resistive element. Likewise the contact points may be uniformly spaced along a length of the resistive element, or the contact points may be spaced along a length of the resistive element according to a non-uniform scale.

According to a further aspect of the invention, the resistive element has a first portion over which all the number of contact points are spaced, and a second portion having a resistance that is at least as great as a resistance of the first portion. The ground point may be a first ground point, in which case the resistive element has a second ground point for connection to a ground potential. The interface may further include a bias resistor connected to the resistive element and for connection to a ground potential. The bias resistor may include a bias point for application of a bias potential.

According to another embodiment of the invention, the interface for a key input apparatus to an electronic device includes a sense resistance having an input point for connection to a voltage source, a resistive element having a number of contact points, a first bias resistor connected to the resistive element and for connection to a ground potential, and a second bias resistor connected to the resistive element and for connection to a ground potential. The interface also includes a number of key switches connected to the sense resistance. Each of the key switches corresponds to one of the number of contact points, and the key switches are disposed such that when one of the key switches is asserted, electrical connection is made between the corresponding contact point and the input point, forming an electrical path from the input point to the ground point through the sense resistance, the asserted key switch, and at least a portion of the resistive element. The interface further includes a sampling point on the electrical path for providing a sampling voltage to a decoder of the electronic device when one of the number of key switches is asserted.

BRIEF DESCRIPTION OF THE DRAWINGS

These and other objects and advantages of the invention will become apparent in view of the written description of the invention and the associated drawings, in which.

DETAILED DESCRIPTION OF THE INVENTION

Figure 1:
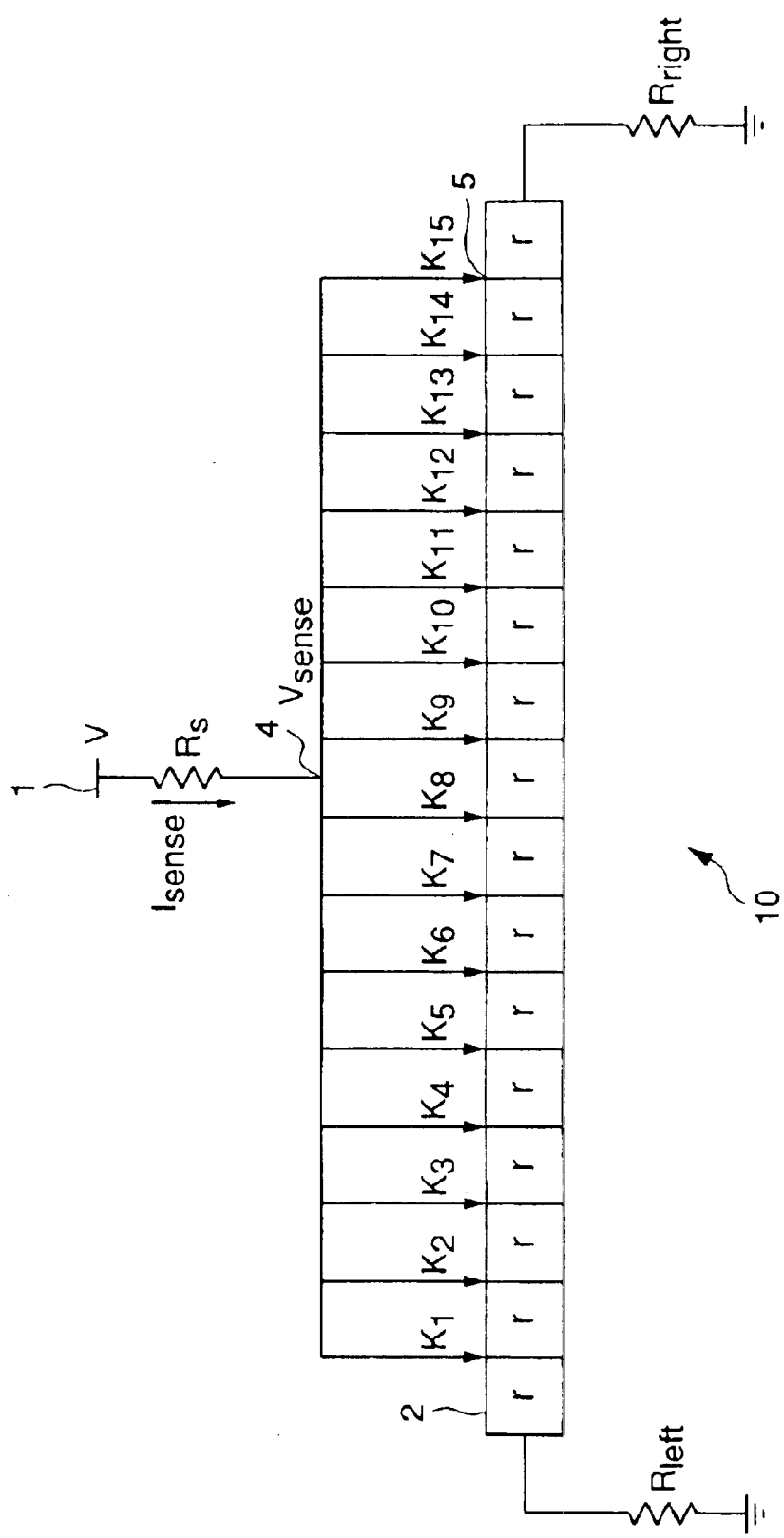
FIG. 1 is a schematic diagram of an exemplary embodiment of the invention.

Referring to FIG. 1, a key input apparatus interface 10 of the invention is shown. The interface 10 includes a voltage source 1 for providing a reference voltage to a resistive element 2. The resistive element 2 has a resistance that is substantially uniform across the length of the resistive element 2. The resistive element 2 includes a number of contact points along its length at substantially equal distances, so that the portions of the resistive element 2 located between each pair of adjacent contact points have a substantially equal resistances. In the example shown in FIG. 1, the resistive element 2 is divided into sixteen portions by fifteen contact points, each portion having a resistance r.

The interface 10 also includes a sense resistance $R_S$ connected to the voltage source 1 to provide a reference current to the resistive element 2, and may include one or more additional resistors to provide a reference current or voltage measurement. Examples of two such resistors are shown in FIG. 1 as $R_{LEFT}$ and $R_{RIGHT}$.

A number of keys K1–K15 of a key input apparatus are disposed to provide electrical connection between the voltage source 1 and the contact points on the resistive element 2 when a key is depressed. These keys K1–K15 may include momentary switches or the like, so that when depressed or asserted in any other manner, an electrical connection is made between the voltage source and the contact point disposed nearest the depressed key, through the sensing resistor $R_S$, When pressure is released from the key, this connection is broken.

When a key is depressed, a voltage $V_{SENSE}$ can be measured at a sampling point 4. For the exemplary circuit shown in FIG. 1, the resistive element 2 is divided by fifteen contact points into sixteen resistive portions, each having a resistance value of r. When a key Kn is depressed, a corresponding contact point completes an electrical connection to the voltage source. For this example, the sampling point can be considered to be a point in a voltage divider in which one resistor is the sensing resistor $R_S$, and the other resistor has the value of $(R_{LEFT}+nr)\|(R_{RIGHT}+(16r-nr))$, where the symbol "$\|$" indicates the equivalent resistance of two parallel resistances. To further simplify the example, the case where $R_{LEFT}=R_{RIGHT}=0$ and $R_S=r$ will be examined. In this case, the current $I_{SENSE}=V_S/(r+(nr\|(16r-nr))$. Thus, if the key K15 is depressed, the current $I_{SENSE}=(16/31)(V_S/r)$. Likewise, if the key K8 is depressed, the current $I_{SENSE}=(1/5)(V_S/r)$. Based on the current $I_{SENSE}$, the voltage $V_{SENSE}$ at the sampling point 4 can be calculated. The following table lists calculated sense currents and voltages for all depressed keys in this example.

TABLE 1

| Key | $I_{SENSE}$ ($V_S/r$) | $V_{SENSE}$ |
|---|---|---|
| K1 | 16/31 | 0.4839 $V_S$ |
| K2 | 4/11 | 0.6364 $V_S$ |
| K3 | 16/55 | 0.7091 $V_S$ |
| K4 | 1/4 | 0.7500 $V_S$ |
| K5 | 16/71 | 0.7746 $V_S$ |
| K6 | 4/19 | 0.7895 $V_S$ |
| K7 | 16/79 | 0.7975 $V_S$ |
| K8 | 1/5 | 0.8000 $V_S$ |
| K9 | 16/79 | 0.7975 $V_S$ |
| K10 | 4/19 | 0.7895 $V_S$ |
| K11 | 16/71 | 0.7746 $V_S$ |
| K12 | 1/4 | 0.7500 $V_S$ |
| K13 | 16/55 | 0.7091 $V_S$ |
| K14 | 4/11 | 0.6364 $V_S$ |
| K15 | 16/31 | 0.4839 $V_S$ |

As shown in Table 1, depressing different keys results in different currents flowing through the sensing resistor $R_S$ and therefore in different sense voltages measured at the sampling point 4. This sense voltage can be applied as an input to a decoder, which may include an analog-to-digital converter to translate the voltage level at sampling point 4 to a digital value, for interpreting the sense voltage to detect the depression of the corresponding key.

It is also evident from the data in Table 1 that the sensing voltage is not unique for each key; complementary pairs of keys each result in the same sensing voltage. This situation requires that further processing take place prior to providing an output to the decoder in order to determine the specific key that was depressed. Further, the progression of the sensing voltage between adjacent keys is not linear over the range of keys. This makes programming of the decoder more difficult than if a fixed incremental change in sensing voltage were produced by successive depressing adjacent keys.

The above-noted deficiencies can be overcome at least in part by modification of the exemplary circuit. For example, the resistive element 2 can have a resistance value that is scaled along the length of the element, rather than being uniform, in such a manner that the resulting sensing voltage change among adjacent keys is substantially linear. In a different embodiment of the invention, the resistance of the resistive element 2 may be uniform along the length of the element, but the contact points may be spaced at non-uniform scaled distances from each other, resulting in varying resistance values between adjacent contact points and more linear sensing voltage values for successive key depressions. Alternatively, $R_{LEFT}$ and $R_{RIGHT}$ may have some non-zero value and a bias voltage may be applied across, for example, $R_{LEFT}$, to provide variance and linearity.

A further different embodiment may have contact points on only one side of the resistive element, ensuring that each key will result in a unique sensing voltage level and still providing decoding for numerous keys with only one input to the decoder. For example, in the circuit of FIG. 1, the keys K9–K15 can be removed, leaving only keys K1–K8. The resistive element 2 would then have nine resistive portions, eight each having a resistance of r and one having a resistance of 8r. Alternatively, the resistive element 2 may have an enlarged resistance on one side. For example, the resistance of the portion to the right of the key K15 contact point may be increased to 15r. In the general case, n keys K1–Kn may be provided opposite n contact points on one portion of the resistive element, with the other portion of the resistive element 2 having a resistance that is greater than or equal to nr.

Figure 3A:
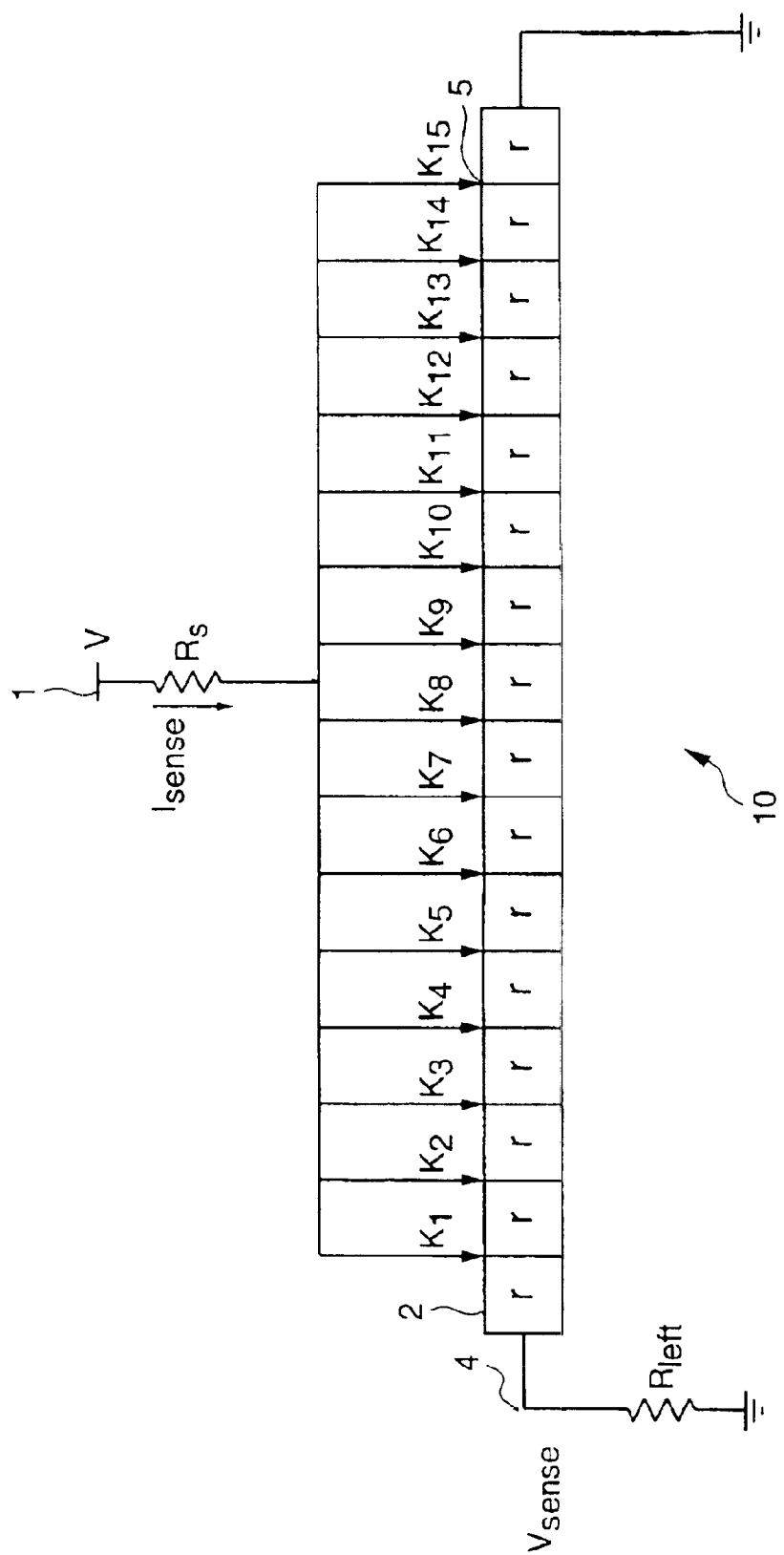
FIG. 3A is a schematic diagram of another embodiment of the invention.

Another alternative embodiment, illustrated in FIG. 3A, could have the sensing voltage taken across $R_{LEFT}$, while removing $R_{RIGHT}$ and the associated ground connection from the resistive element altogether. This arrangement would provide a linear progression of voltage outputs for successive depression of adjacent keys, and would also provide unique voltage outputs for depressions of different keys.

Figure 2:
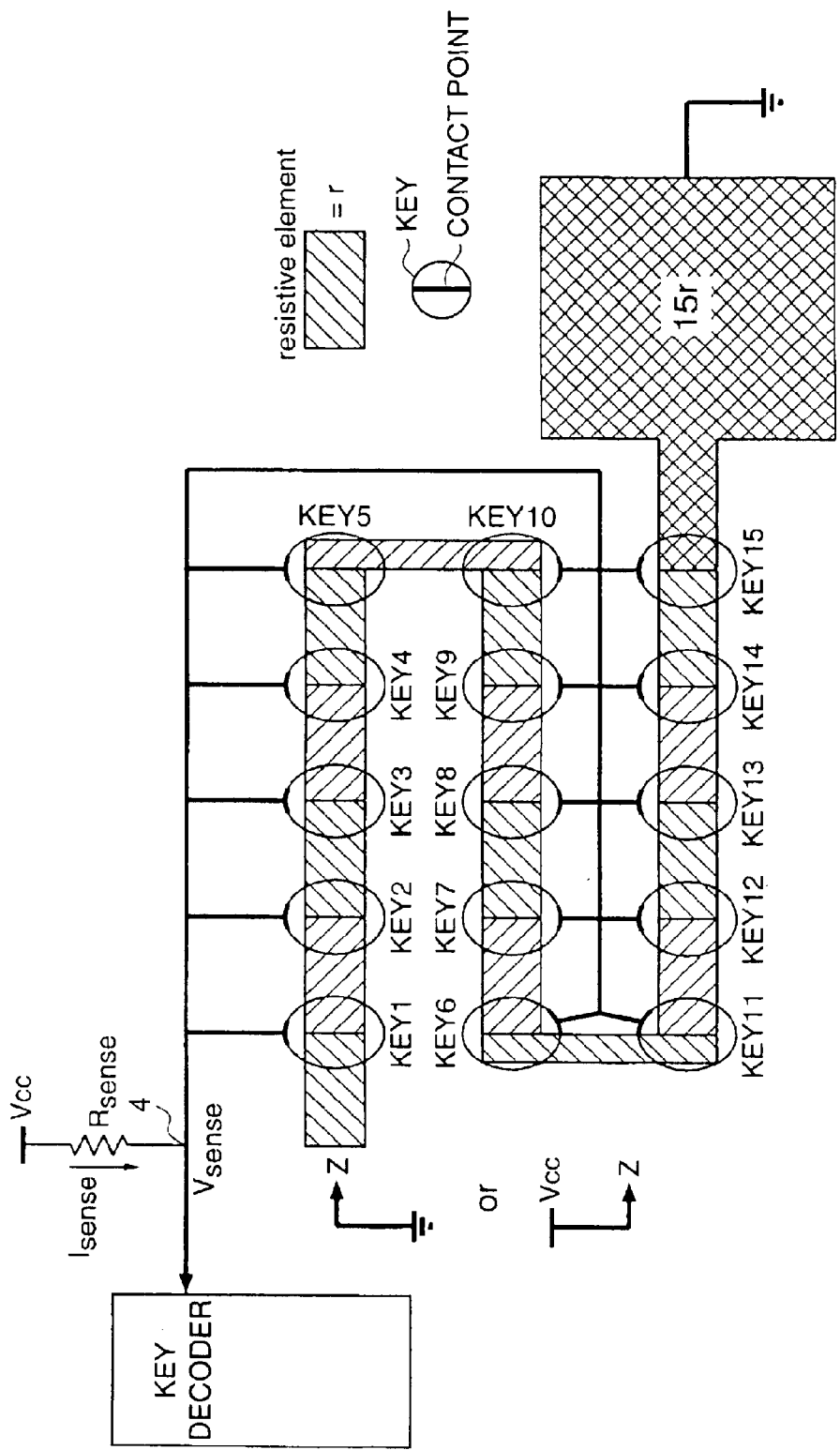
FIG. 2 is an exemplary layout diagram of the invention.
Figure 3B:
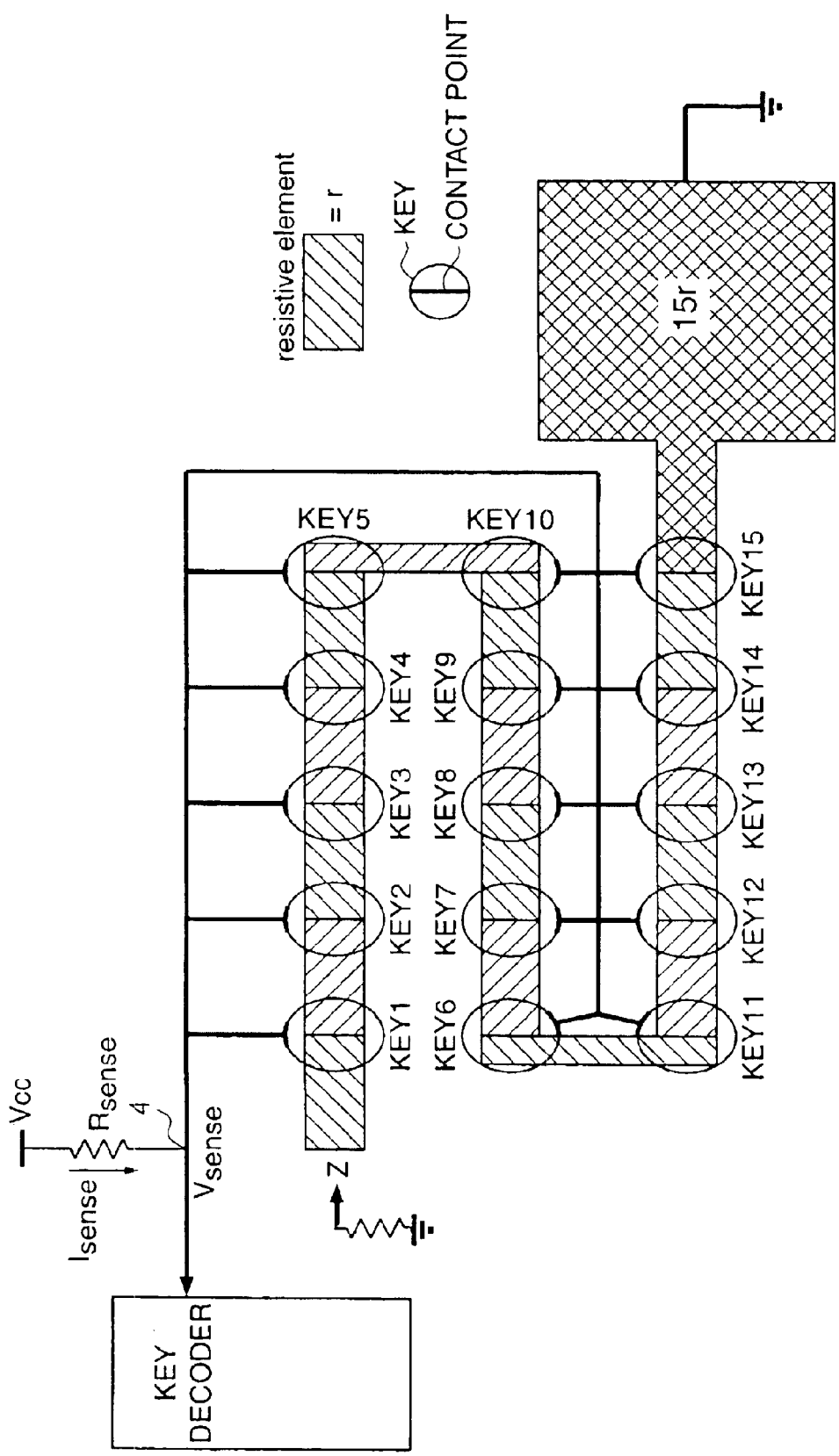
FIG. 3B is a schematic diagram of yet another embodiment of the invention.

FIG. 2 shows an exemplary layout for a fifteen-key-contact embodiment of the invention, which can be fabricated on a PCB or the like. According to one aspect of the invention, the resistive element may be fabricated such that it is embedded inside the Layers of the PCB. In the example shown in FIG. 2, the resistive element includes a resistive portion having a resistance of 15r to one side of the contact point for the key K15. As shown in the figure, the sampling point 4 is provided as an input to the key decoder, which may include an analog-to-digital converter or other circuit to translate the input voltage to a digital value. According to alternative embodiments mentioned above, a biasing voltage may be applied at point Z, or a voltage sensed across a resistor between point Z and ground may be used as the input to the key decoder. (The latter embodiment is illustrated in FIG. 3B.) As would be apparent to persons of ordinary skill in the art, a sense current can be provided as an input to a key decoder that reads a current, rather than a voltage.

The described invention accomplishes the keyboard entry function using a circuit that is not as complicated as conventional systems, and further requires less area to lay out the design. The design of the invention also provides decoding for a large number of keys while using only one input port to the key decoder. That is, the invention is not limited for use with the fifteen-key input apparatus shown by way of example herein. Rather, an apparatus having any number of keys is compatible with the interface of the invention, and the interface requires only one input/output port of the key decoder regardless of the number of keys used.

The invention has been described using exemplary preferred embodiments. However, it is to be understood that the scope of the invention is not limited to the disclosed embodiments. To the contrary, the scope of the invention is intended to include various modifications and similar arrangements. The scope of the appended claims, therefore, should be accorded the broadest interpretation so as to encompass all such modifications and similar arrangements.

What is claimed is:

1. An interface for a key input apparatus to an electronic device, comprising:
   a resistive element having a ground point for connection to a ground potential, and three or more contact points such that the resistive element includes a plurality of pairs of first and second contact points in which the first and second contact points are adjacent to each other;
   a plurality of key switches connected to an input point which is, in turn, connected to a voltage source, wherein each of the plurality of key switches is disposed with respect to a corresponding one of the plurality of contact points such that when one of the plurality of key switches is asserted to contact the corresponding contact point, an electrical path is formed from the input point to the ground point through the asserted key switch and at least a portion of the resistive element;
   a sampling point on the electrical path for providing a sampling voltage to a decoder of the electronic device when one of the plurality of key switches is asserted; and
   means for producing substantially equal sampling voltage differences for each of the plurality of pairs of first and second adjacent contact points, wherein a sampling voltage difference for a pair of first and second contact points is a difference between the magnitude of a first sampling voltage produced when the first contact point of the pair is contacted by a corresponding first key switch and the magnitude of a second sampling voltage produced when the second contact point of the pair is contacted by a corresponding second key switch.

2. The interface of claim 1, further comprising a sense resistance connected between the input point and the plurality of key switches, wherein the sampling point is a point at which the plurality of key switches is connected to the sense resistance.

3. The interface of claim 1, wherein the resistive element has a first portion over which all of the plurality of contact points are spaced, and a second portion having a resistance that is at least as great as a resistance of the first portion.

4. The interface of claim 1, further including a first resistor connected between the ground point of the resistive element and the ground potential.

5. The interface of claim 4, wherein the ground point is a first ground point and the resistive element has a second ground point for connection to the ground potential, the interface further including a second resistor connected between the second ground point of the resistive element and the ground potential.

6. The interface of claim 5, wherein the first resistor includes a bias point for application of a bias voltage across the first resistor.

7. The interface of claim 4, wherein the sampling point is the ground point.

8. The interface of claim 1, wherein the means for producing substantially equal change in sampling voltage between each pair of asserted keys corresponding to adjacent contact points is implemented by constructing the resistive element so that the total resistance between adjacent contact points varies along a length of the resistive element.

9. The interface of claim 8, wherein the resistive element has a resistance that is non-uniform along a length of the resistive element.

10. The interface of claim 9, wherein the contact points are uniformly spaced along a length of the resistive element.

11. The interface of claim 8, wherein the contact points are non-uniformly spaced alone a length of the resistive element.

12. The interface of claim 11, wherein the resistive element has a resistance that is uniform along a length of the resistive element.

13. An interface for a key input apparatus to an electronic device, comprising:
   a resistive element having a plurality of contact points and a ground point for connection to a ground potential, wherein the resistive element has a first portion over which all of the plurality of contact points are spaced and a second portion, adjacent to the first portion, having a resistance that is at least as great as a resistance of the first portion;
   a plurality of key switches connected to an input point which is, in turn, connected to a voltage source, wherein each of the plurality of key switches is disposed with respect to a corresponding one of the plurality of contact points such that when one of the plurality of key switches is asserted, electrical connection is made between the corresponding contact point and the input point, forming an electrical path from the input point to the ground point through the asserted key switch and at least a portion of the resistive element; and
   a sampling point on the electrical path for providing a sampling voltage to a decoder of the electronic device when one of the plurality of key switches is asserted.

14. The interface of claim 13, further comprising a sense resistance connected between the input point and the plurality of key switches, wherein the sampling point is a point at which the plurality of key switches is connected to the sense resistance.

15. The interface of claim 13, wherein the resistive element is constructed so that the total resistance between adjacent contact points varies along a length of the resistive element.

16. The interface of claim 15, wherein the resistive element has a resistance that is non-uniform along a length of the resistive element.

17. The interface of claim 16, wherein the contact points are uniformly spaced along a length of the resistive element.

18. The interface of claim 15, wherein the contact points are non-uniformly spaced along a length of the resistive element.

19. The interface of claim 18, wherein the resistive element has a resistance that is uniform along a length of the resistive element.

20. The interface of claim 13, further including a first resistor connected between the ground point of the resistive element and the ground potential.

21. The interface of claim 20, wherein the sampling point is the ground point.

22. The interface of claim 20, wherein the ground point is a first ground point and the resistive element has a second ground point for connection to the ground potential, the interface further including a second resistor connected between the second ground point of the resistive element and the ground potential.

23. The interface of claim 22, wherein the first resistor includes a bias point for application of a bias voltage across the first resistor.

24. An interface for a key input apparatus to an electronic device, comprising:

a resistive element having a plurality of contact points and a ground point for connection to a ground potential, wherein the resistive element is integrally formed with a printed circuit board;

a plurality of key switches connected to an input point which is, in turn, connected to a voltage source, wherein each of the plurality of key switches is disposed with respect to a corresponding one of the plurality of contact points such that when one of the plurality of key switches is asserted, electrical connection is made between the corresponding contact point and the input point, forming an electrical path from the input point to the ground point through the asserted key switch and at least a portion of the resistive element; and a sampling point on the electrical path for providing a sampling voltage to a decoder of the electronic device when one of the plurality of key switches is asserted.

* * * * *